United States Patent
Mortazawi et al.

(10) Patent No.: US 10,784,723 B2
(45) Date of Patent: Sep. 22, 2020

(54) NONLINEAR RESONANCE CIRCUIT FOR WIRELESS POWER TRANSMISSION AND WIRELESS POWER HARVESTING

(71) Applicant: The Regents of The University of Michigan, Ann Arbor, MI (US)

(72) Inventors: Amir Mortazawi, Ann Arbor, MI (US); Xiaoyu Wang, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 16/253,013

(22) Filed: Jan. 21, 2019

(65) Prior Publication Data

US 2019/0157908 A1    May 23, 2019

Related U.S. Application Data

(63) Continuation-in-part of application No. 15/153,219, filed on May 12, 2016, now Pat. No. 10,199,869.

(60) Provisional application No. 62/160,161, filed on May 12, 2015.

(51) Int. Cl.
| | |
|---|---|
| *F03G 7/08* | (2006.01) |
| *H02J 50/12* | (2016.01) |
| *H01F 38/14* | (2006.01) |
| *H02J 50/05* | (2016.01) |
| *H03H 7/40* | (2006.01) |

(52) U.S. Cl.
CPC ............. *H02J 50/12* (2016.02); *H01F 38/14* (2013.01); *H02J 50/05* (2016.02); *H03H 7/40* (2013.01)

(58) Field of Classification Search
CPC .......... H02J 50/12; H02J 50/05; H01F 38/14; H03H 7/40
See application file for complete search history.

(56) References Cited

U.S. PATENT DOCUMENTS

| | | | |
|---|---|---|---|
| 4,858,066 A | 8/1989 | McSweeney | |
| 5,930,364 A | 7/1999 | Kim | |
| 7,843,288 B2 | 11/2010 | Lee et al. | |
| 9,257,958 B2 | 2/2016 | Yong et al. | |
| 2007/0126534 A1* | 6/2007 | Himi | H01P 7/10 333/219.1 |
| 2009/0040131 A1* | 2/2009 | Mosallaei | B33Y 80/00 343/911 R |
| 2009/0128262 A1* | 5/2009 | Lee | H01Q 7/00 333/219.1 |
| 2009/0134960 A1 | 5/2009 | Larson et al. | |
| 2010/0225423 A1* | 9/2010 | Eddy | H01P 1/2053 333/230 |
| 2010/0289449 A1 | 11/2010 | Elo | |

(Continued)

*Primary Examiner* — Alfonso Perez Borroto
*Assistant Examiner* — Esayas G Yeshaw
(74) *Attorney, Agent, or Firm* — Harness, Dickey & Pierce, P.L.C.

(57) ABSTRACT

A nonlinear resonator is presented that enhances the bandwidth while providing high resonance amplitude. The nonlinear resonance circuit is comprised of an inductor electrically coupled to a capacitor, where either the inductor or capacitor is nonlinear. Response of the nonlinear resonance circuit to an excitation signal is described by a family of second-order differential equations with cubic-order nonlinearity, known as Duffing equations. In one aspect, the nonlinear resonator is implemented by a nonlinear dielectric resonator.

6 Claims, 15 Drawing Sheets

(56) References Cited

U.S. PATENT DOCUMENTS

| | | | |
|---|---|---|---|
| 2011/0086600 A1* | 4/2011 | Muhammad | H04B 1/0458 |
| | | | 455/120 |
| 2011/0095648 A1 | 4/2011 | Zhang | |
| 2011/0315496 A1* | 12/2011 | Bohori | B60L 5/005 |
| | | | 191/10 |
| 2012/0217818 A1* | 8/2012 | Yerazunis | H04B 5/0037 |
| | | | 307/104 |
| 2012/0242159 A1 | 9/2012 | Lou et al. | |
| 2012/0293900 A1 | 11/2012 | Kim et al. | |
| 2013/0200721 A1 | 8/2013 | Kurs et al. | |
| 2013/0249630 A1 | 9/2013 | Lopez et al. | |
| 2014/0167704 A1 | 6/2014 | Lafontaine et al. | |
| 2015/0051750 A1 | 2/2015 | Kurs et al. | |
| 2015/0135869 A1* | 5/2015 | Jia | H02N 2/188 |
| | | | 74/96 |
| 2015/0236840 A1* | 8/2015 | Link | H04L 5/14 |
| | | | 370/281 |
| 2015/0280444 A1 | 10/2015 | Smith et al. | |
| 2016/0072472 A1 | 3/2016 | Fedder et al. | |
| 2016/0269060 A1 | 9/2016 | Salfelner | |

\* cited by examiner

NONLINEAR RESONANCE CIRCUIT FOR WIRELESS POWER TRANSMISSION AND WIRELESS POWER HARVESTING

CROSS-REFERENCE TO RELATED APPLICATIONS

This application is a continuation-in-part of U.S. Ser. No. 15/153,219 filed May 12, 2016 which claims the benefit of U.S. Provisional Application No. 62/160,161 filed on May 12, 2015. The entire disclosures of the above applications are incorporated herein by reference.

FIELD

The present disclosure relates to a nonlinear resonance circuit for wideband wireless power transfer and harvesting applications.

BACKGROUND

High quality factor (Q) resonators are widely used in wireless power harvesting and wireless power transfer systems. However, the operating bandwidth of high Q resonators is very limited since the bandwidth of linear resonators is inversely proportional to Q ($BW=f_0/Q$, where $f_0$ is the resonance frequency). Although high Q resonators allow for efficient operation, their performance degrade rapidly with due coupling factor variation, as well as frequency detuning due to environmental effects, coupling to nearby objects, component aging and tolerances.

Specifically, high Q resonators are often used in wireless power transfer (WPT) systems, to achieve high transfer efficiency at longer distances. Such systems exhibit "frequency split" phenomenon. The highest performance is achieved when the resonant coils are critically coupled to each other, corresponding to a specific coupling factor and operation frequency. At coupling factors beyond the critical coupling (i.e. over-coupled regions, e.g. at closer distances), frequency split phenomenon occurs meaning that the maximum power transfer efficiency is achieved at two different frequencies apart from the original operation frequency. At coupling factors below the critical coupling (i.e. under-coupled region, for example when the distance between the two coils is increased), the optimum frequency of operation remains the same, yet the transfer efficiency decays exponentially. In practical applications, a WPT system is usually designed to operate at the critical-coupled condition to achieve optimum power transfer efficiency. Due to resonance nature of coupling, its performance is susceptible to coupling factor variation. Coupling factor variation can also occur due to both lateral and angular misalignment between the coils, as well as coupling to nearby objects.

In wireless power harvesters, the RF power collected by an antenna or any energy pickup device is rectified and regulated before being delivered to a load. A high quality factor (Q) resonator placed in the impedance matching network in-between the antenna and the rectifier increases the RF voltage through Q multiplication, which is desirable for overcoming the threshold voltage of the rectifiers and therefore improving the rectification efficiency at low power levels. However as mentioned before, harvesters employing conventional high Q resonators are vulnerable to frequency misalignment and frequency drift. Although it is possible to design an active frequency-tracking mechanism for these systems, such a tracking circuit not only requires power for its operation, but also increases complexity and cost.

This disclosure presents a new approach for improving the bandwidth of high Q RF resonators. A nonlinear resonator is developed to enhance the bandwidth while maintaining high resonance amplitude.

This section provides background information related to the present disclosure which is not necessarily prior art.

SUMMARY

This section provides a general summary of the disclosure, and is not a comprehensive disclosure of its full scope or all of its features.

A nonlinear resonance circuit is provided that enhances bandwidth while providing high resonance amplitude. The nonlinear resonance circuit includes an inductor and a capacitor electrically coupled to the inductor, where one or both of the inductor and the capacitor is nonlinear. Response of the nonlinear resonance circuit to an excitation signal is described by a second-order differential equation with cubic-order nonlinearity (e.g., a Duffing equation). The nonlinear resonance circuit is useful for many different applications, including wireless power harvesting and wireless power transfer systems.

In another aspect, resonators in a wireless power transfer system are replaced by nonlinear dielectric resonators.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 13:
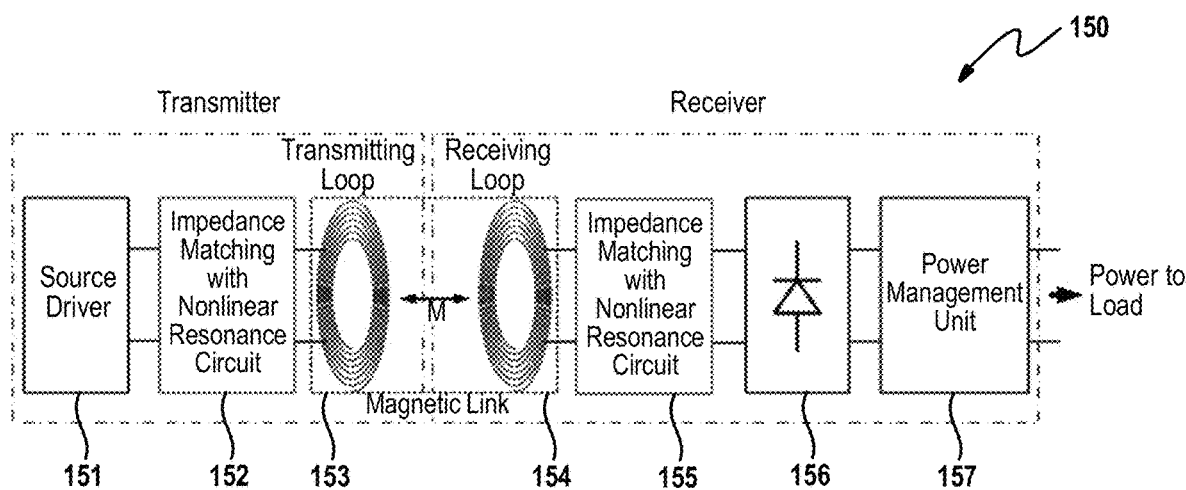
Figure 14A:
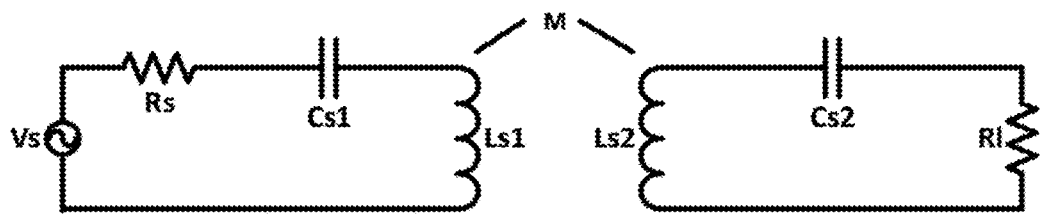
Figure 14B:
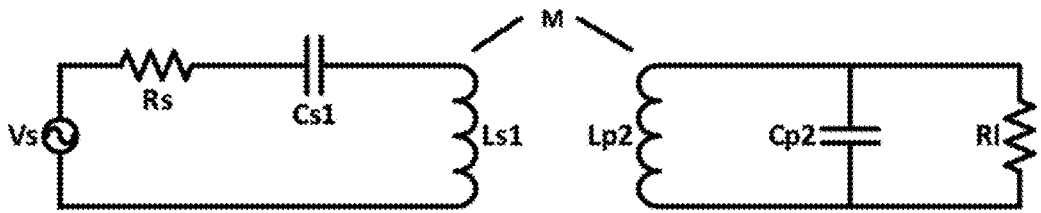
Figure 14C:
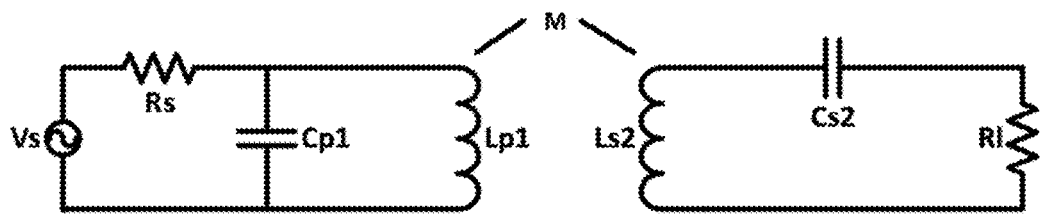
Figure 14D:
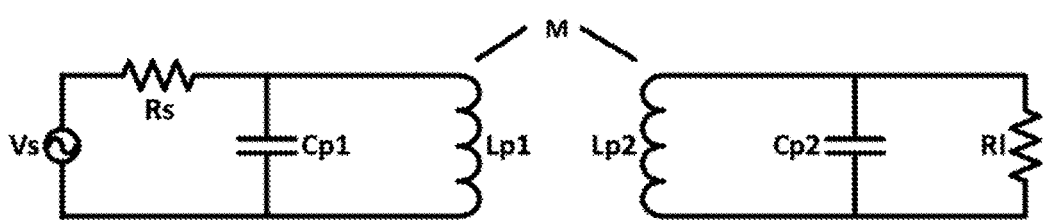
Figure 15:
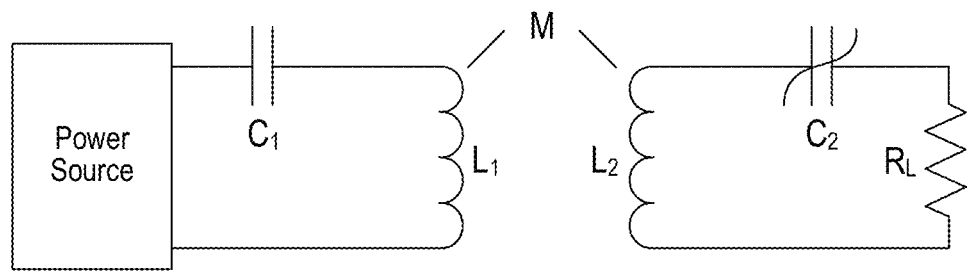
Figure 16:
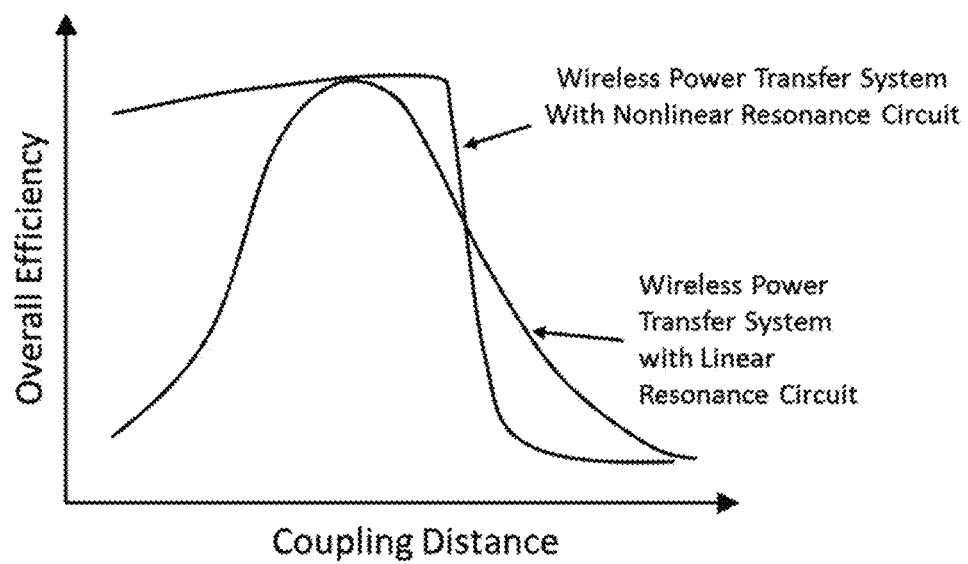
Figure 17:
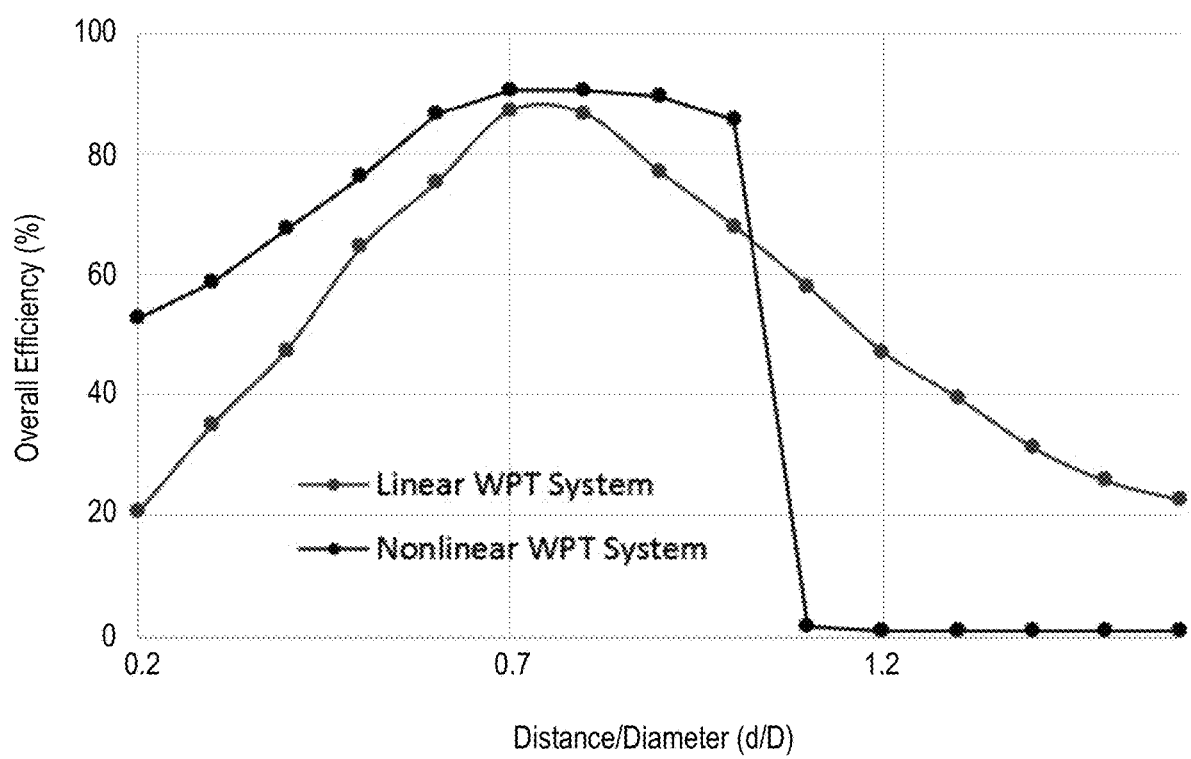
Figure 18:
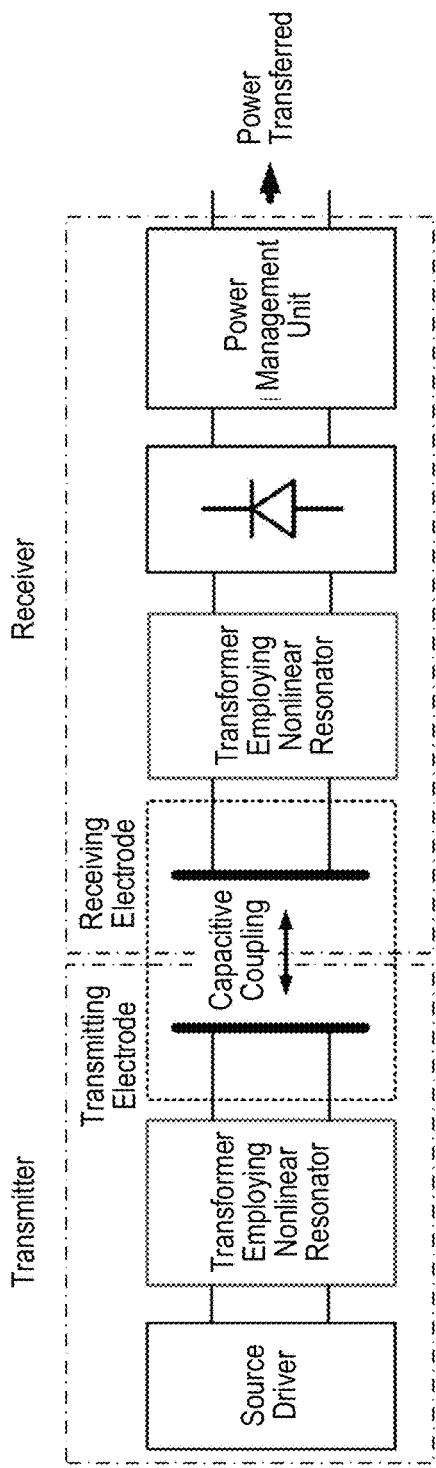
Figure 19:
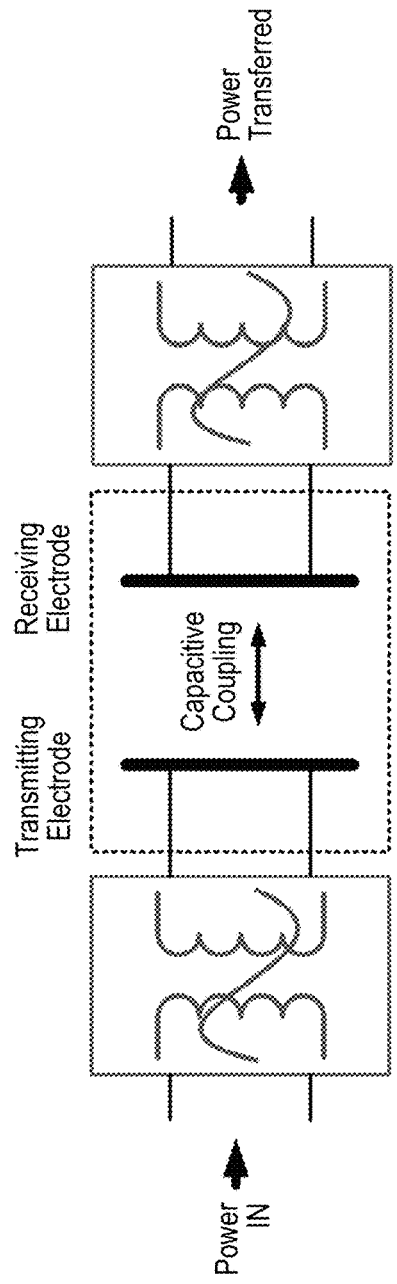
Figure 20A:
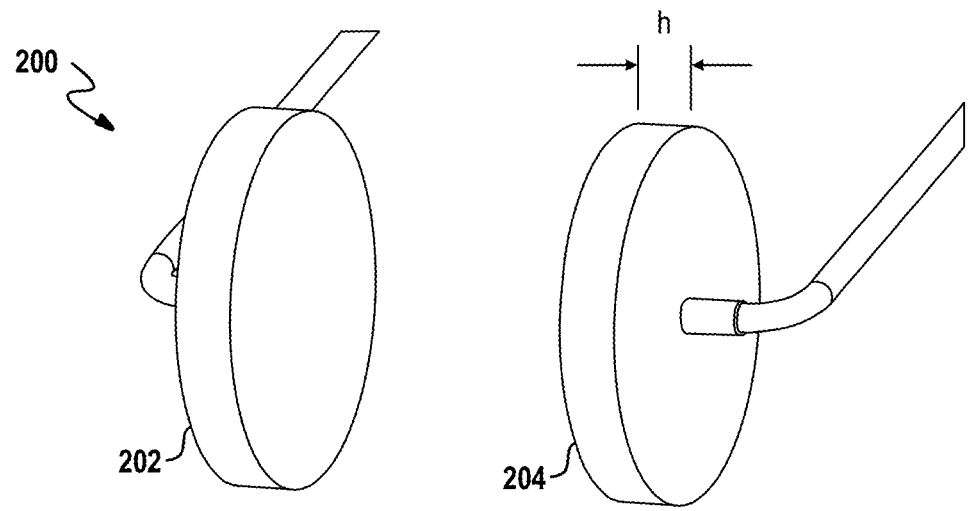
Figure 20B:
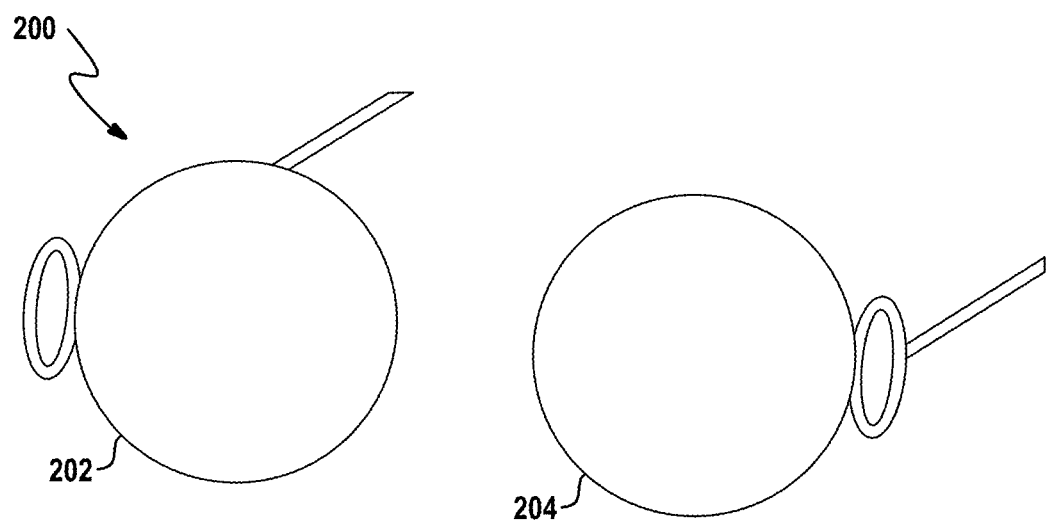
Figure 21:
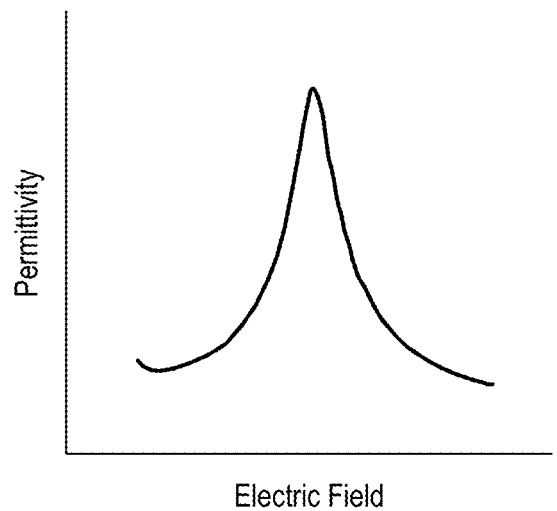
Figure 22:
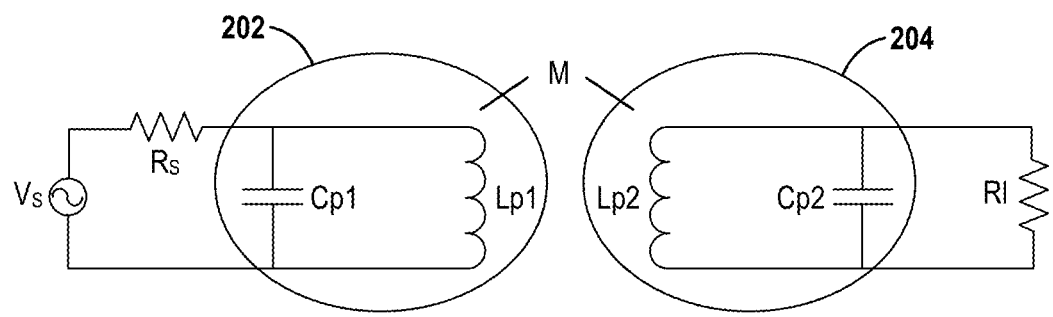
Figure 23:
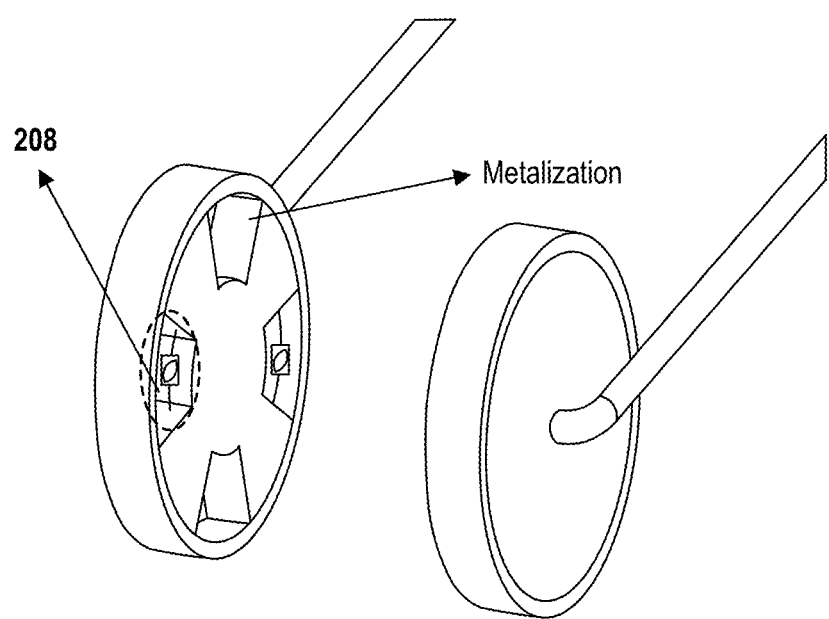

FIG. 13 a block diagram for an example of wireless power transfer system using the nonlinear resonance circuit;

FIGS. 14A-14D depict four different topologies of a two-coil wireless power transfer system;

FIG. 15 is a schematic of an example embodiment of a wireless power transfer system employing the nonlinear resonance circuit;

FIG. 16 is a graph depicting the overall efficiency as a function of coupling distance for a wireless power transfer system using the nonlinear resonance circuit, in comparison with the overall efficiency of a wireless power transfer system with a linear resonator circuit;

FIG. 17 is a graph depicting measurement results showing the comparison between power transfer efficiency as a function of coupling factor;

FIG. 18 is a block diagram for an example capacitive wireless power transmission system;

FIG. 19 is a schematic of an example embodiment of a capacitive wireless power transmission system employing the nonlinear resonance circuits;

FIGS. 20A and 20B depict nonlinear dielectric resonators with a cylindrical and spherical shape, respectively;

FIG. 21 is a graph showing the nonlinear response in permittivity of the dielectric material;

FIG. 22 is a schematic of an equivalent circuit model for the wireless power transfer system with nonlinear dielectric resonators; and FIG. 23 depicts nonlinear dielectric resonators with one or more electronic components embedded therein.

Corresponding reference numerals indicate corresponding parts throughout the several views of the drawings.

DETAILED DESCRIPTION

Example embodiments will now be described more fully with reference to the accompanying drawings.

Figure 1A:
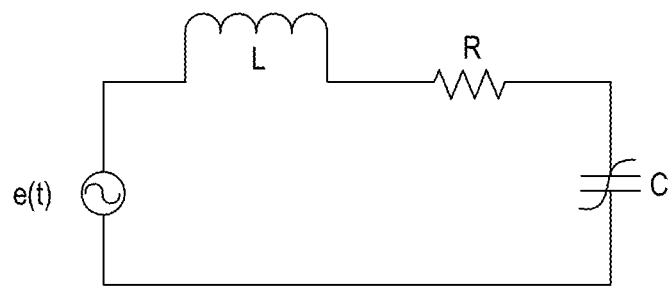
FIG. 1A is a schematic for a nonlinear resonance circuit with a nonlinear capacitor.
Figure 1B:
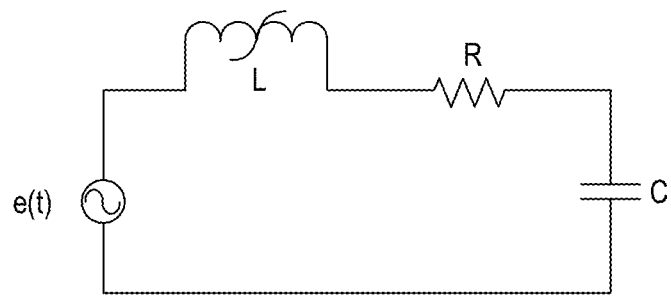
FIG. 1B is a schematic for a nonlinear resonance circuit with a nonlinear inductor.
Figure 1C:
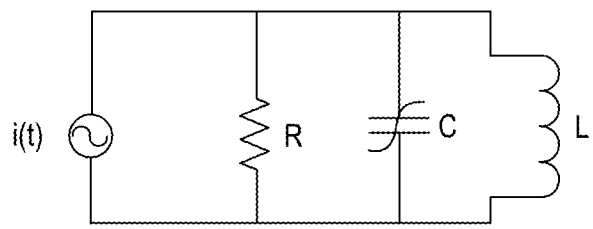
FIG. 1C is a schematic for a shunt nonlinear resonance circuit with a nonlinear capacitor.
Figure 1D:
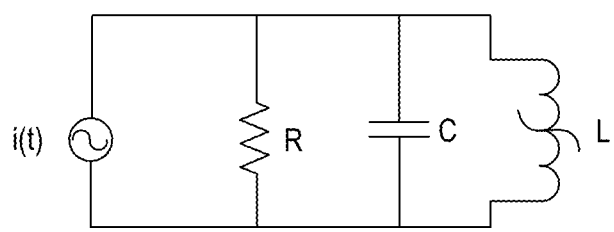
FIG. 1D is a schematic for a shunt nonlinear resonance circuit with a nonlinear inductor.

FIG. 1A-1D illustrates different nonlinear resonance circuits that enhance the bandwidth while providing high resonance amplitude. Each nonlinear resonance circuit 10 is comprised of an inductor 11 electrically coupled to a capacitor 13, where either the inductor, or the capacitor, or both, are nonlinear. The nonlinear resonance circuit can comprise either a series-resonance or a shunt resonance structure. In FIG. 1A, a series nonlinear resonance circuit is shown with a nonlinear capacitor C in series with an inductor L and a resistor R; whereas, in FIG. 1B, the series nonlinear resonance circuit is shown with a nonlinear inductor L in series with a capacitor C and a resistor R. In FIG. 1C, a shunt resonance circuit is shown with a nonlinear capacitor electrically coupled in parallel with an inductor and a resistor; whereas, in FIG. 1D, a shunt resonance circuit is shown with a nonlinear inductor electrically coupled in parallel with a capacitor and a resistor.

With reference to FIG. 1A, response of the series nonlinear resonance circuit to an excitation signal is described by a family of second-order differential equations with cubic-order nonlinearity, known as Duffing equations. The Duffing equation was proposed by Georg Duffing with the initial purpose of characterizing mechanical oscillations with nonlinear restoring force. The basic form of the Duffing equation is usually written as (1):

$$\ddot{x}+2y\dot{x}+\omega_o^2 x+\in x^3=F\cos(\omega t) \qquad (1)$$

where x is displacement, y is the damping coefficient, $\omega_o$ is the natural oscillation frequency, $\in$ is the third order nonlinearity coefficient, and $F\cos(\omega t)$ is the excitation with the amplitude F and angular frequency $\omega$.

The steady state solution of (1) can be approximated as $x(\omega, t)=A(\omega)\cos(\omega t-\theta)$, where "A" represents the frequency-dependent amplitude, and $\theta$ represents the phase difference in reference with the excitation signal. The resonance amplitude "A" as a function of excitation frequency can be determined from (2):

$$A^2\left[(\omega_o^2-\omega^2)+\frac{3}{4}\in A^2\right]^2+(2\gamma A\omega)^2=F^2 \qquad (2)$$

Figure 2:
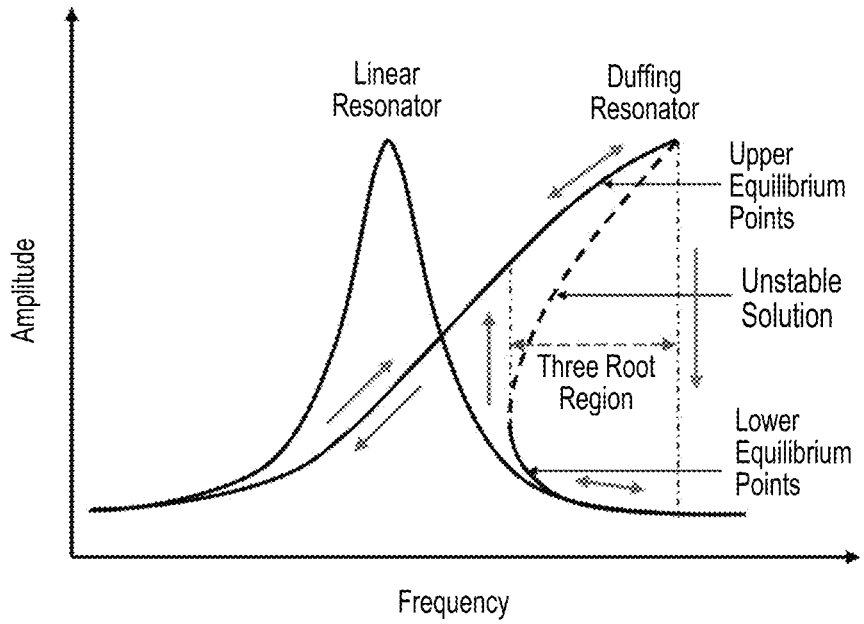
FIG. 2 is a graph depicting the amplitude-frequency response of a Duffing resonator.
Figure 3:
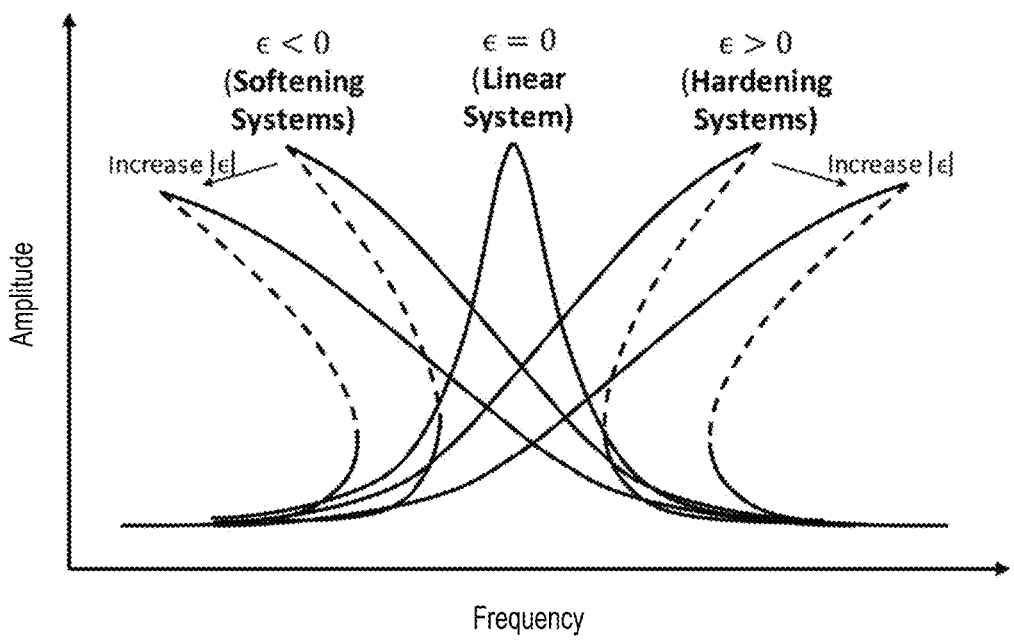
FIG. 3 is a graph depicting the amplitude-frequency response of a Duffing resonator with different nonlinearity coefficients.

The typical amplitude response of a nonlinear resonance circuit is shown in FIG. 2. Unlike the bell-shaped curve of a linear resonator, the peak of the Duffing resonator's frequency response is "tilted" to one side, which results in a three-root region. The medium solution points in this region are unstable, while the upper and lower points are stable (called equilibrium points). As a result, the steady state solution of such a system converges to one of the two equilibrium points depending on the initial conditions. Once the circuit operates on the high-amplitude equilibrium point, resonance amplitude will remain on the upper curve when frequency changes in either direction (increased or decreased), as long as the excitation frequency is lower than the right boundary of the three-root region. Therefore, the right boundary of the three-root region is referred to as the jump down point. However, if the initial condition excites the circuit to the low-amplitude equilibrium point, the amplitude will remain small until the left boundary of the three-root region (the jump up point) is crossed. This forms a hysteresis loop, which is depicted in FIG. 2. The hysteretic behavior allows a properly designed nonlinear resonator to have a much wider bandwidth than a linear resonator with the same Q value, yet achieving the same level of resonance amplitude. The tilt direction of the amplitude-frequency curve is dependent on E (the coefficient of nonlinear term), as shown in FIG. 3. Positive E causes the curve to tilt to the right (called hardening systems), and negative E causes the curve to tilt to the left (called softening systems). Either tilt direction can be used for bandwidth enhancement of resonators, while stronger nonlinearity is desirable to achieve a wider bandwidth.

Figure 4A:
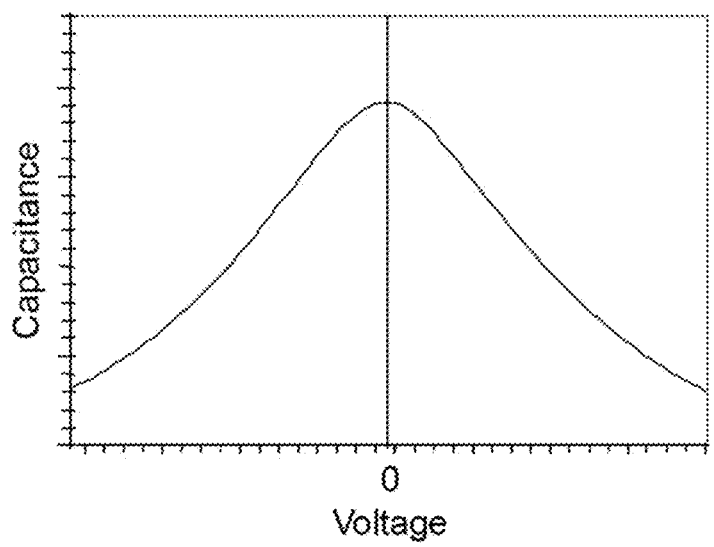
FIGS. 4A and 4B are graphs illustrating symmetric C-V curves for nonlinear capacitors: bell-shaped and well-shaped, respectively.
Figure 4B:
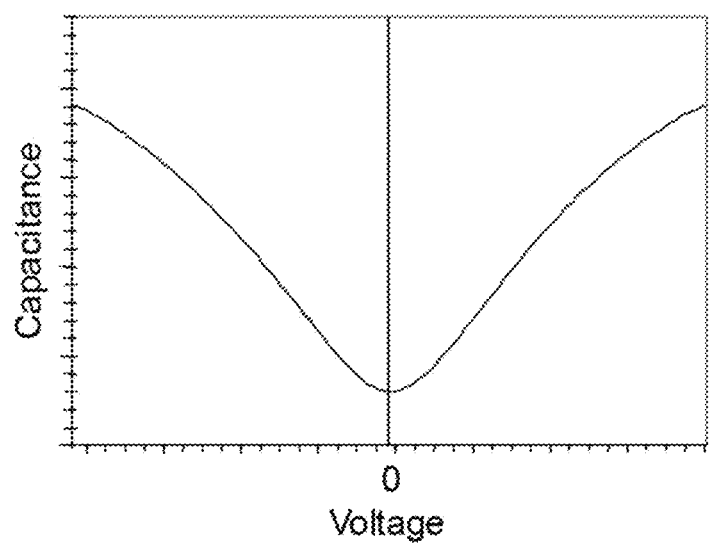

With continued reference to FIG. 1A, the nonlinear resonance circuit consists of a sinusoidal excitation voltage $e(t)=V_s\cdot\cos(\omega t)$, an inductor L, a resistor R (which represents both the intrinsic loss within the resonator and the loss due to the load) and a nonlinear capacitor C. The nonlinear capacitor has a symmetric C-V relationship, i.e., $C(v_C)=C(-v_C)$, which can be either bell-shaped (FIG. 4A) or well-shaped (FIG. 4B). A time-domain expression describing the nonlinear circuit's operation is developed. The expression satisfies the Duffing type equation introduced earlier.

The dynamic equation that describes the circuit's time domain behavior is given by (3):

$$v_C(t) + R\frac{dq_C}{dt} + L\frac{d^2q_C}{dt^2} = e(t) \quad (3)$$

where $e(t)=V_s \cdot \cos(\omega t)$ is the excitation voltage, $v_C(t)$ is the voltage across the nonlinear capacitor, and $q_c$ is the amount of charge stored in the capacitor. For any voltage $v_C$ across the capacitor, the capacitor charge can be expressed as $q_C=f(v_C)=\int_0^{v_C} C(v_C) \cdot dv_c$, which can then be expressed as (4):

$$v_C = f^{-1}(q_c) \quad (4)$$

Since the nonlinear capacitor has a symmetric C-V relationship, the even order terms in the Taylor expansion of (4) vanishes. Neglecting the higher than 3rd order terms for simplicity, the Taylor series expansion of (4) is given by (5) (h.o.t. represents higher order terms):

$$v_C = \frac{1}{a_1}q_c + \frac{1}{a_3}q_C^3 + h.o.t. \quad (5)$$

Substituting (5) into (3) results in (6):

$$\frac{d^2q_C}{dt^2} + \frac{R}{L} \cdot \frac{dq_C}{dt} + \frac{1}{La_1} \cdot q_C + \frac{1}{La_3} \cdot q_C^3 + h.o.t. = \frac{V_s}{L} \cdot \cos(\omega t)$$

It should be noted that (6) has the same form as the Duffing equation described in (1). The solution of (6) can also be written as a sinusoidal function $q_C = A\cos(\omega t - \theta)$, where A is the amplitude of time dependent charge, i.e. the maximum amount of charge stored in the capacitor during one period, and $\theta$ represents the phase difference in regard to the excitation signal. In the resonator, the restoring force is contributed by both the linear term $$\frac{1}{La_1}.$$

$q_C$ and the nonlinear term $$\frac{1}{La_3} \cdot q_C^3.$$

An equivalent linear capacitance $C_{\text{eff}}$ can be defined to quantify the restoring force contributed by the 3rd order nonlinear term, i.e., $$\int_0^{\frac{T}{2}} \left(\frac{1}{La_3} \cdot (A\cos(\omega t))^3\right) \cdot d(A\cos(\omega t)) = \quad (7)$$

$$\int_0^{\frac{T}{2}} \left(\frac{1}{LC_{\text{eff}}} \cdot (A\cos(\omega t))\right) \cdot d(A\cos(\omega t))$$

From (7), $C_{\text{eff}}$ can be derived as (8):

$$C_{\text{eff}} = \frac{a_3}{\frac{3}{4}A^2} \quad (8)$$

The natural frequency of the resonator $\omega_0$ in the presence of nonlinear restoring term can thus be derived as (9):

$$\omega_o = \sqrt{\frac{1}{L}\left(\frac{1}{a_1} + \frac{1}{C_{\text{eff}}}\right)} = \sqrt{\frac{1}{L}\left(\frac{1}{a_1} + \frac{\frac{3}{4}A^2}{a_3}\right)} \quad (9)$$

Figure 5:
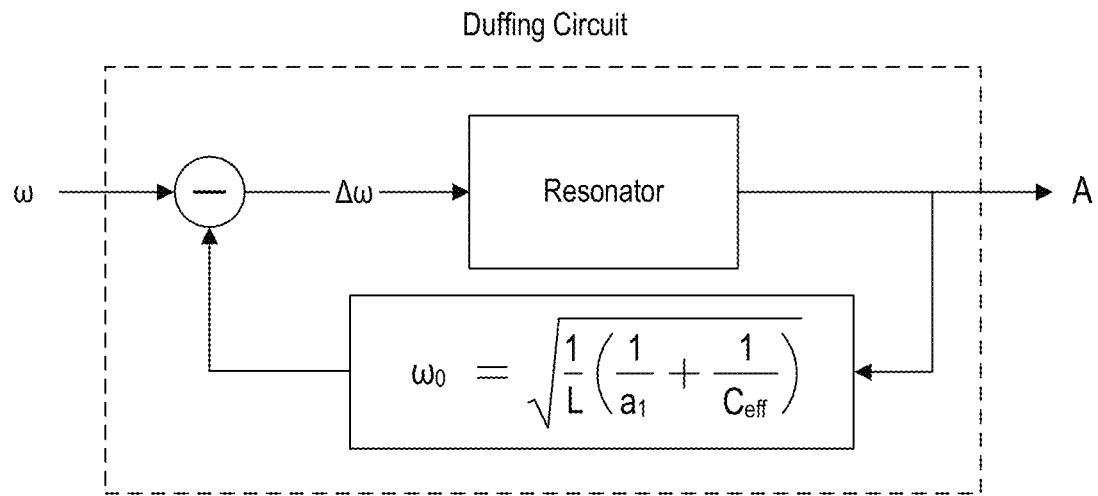
FIG. 5 is a diagram depicting a negative feedback process for the nonlinear resonance circuit showing the feedback term provided by the nonlinear capacitor.

Equation 9 implies that the resonant frequency $\omega_0$ is dependent on the charge "A". The amplitude-dependent resonant frequency behavior of the circuit can be exploited to track the excitation frequency. For example, a varactor with a bell-shaped C-V curve shown in FIG. 4A will have $a_3>0$. Resonators containing such varactors will have a frequency response tilted to the right (a hardening system as shown in FIG. 3). Assuming that the circuit initially converges to its upper equilibrium solution. In this case, when the excitation frequency $\omega$ decreases, the charge "A" decreases. According to (9), the decrease in A results in the decrease of $\omega_0$. Similarly, as $\omega$ increases, "A" will increase, causing $\omega_0$ to increase. Therefore, the natural frequency $\omega_0$ automatically tracks the variation of excitation frequency $\omega$ in both directions (either increasing or decreasing). Hence, the amplitude decrease caused by frequency detuning is reduced. From another point of view, this process can be understood as a negative feedback, as shown in FIG. 5. Because of the bell-shaped C-V characteristic of the nonlinear capacitor, the "average" capacitance during one resonance cycle is dependent on "A"; the higher the resonance amplitude is, the lower the average capacitance will be; and vice versa. Since the inductance value is fixed, the resonance frequency is determined by the average capacitance over a period. Therefore, the amplitude-dependent nonlinear capacitance provides negative feedback to the resonator's natural frequency, which reduces the difference between the excitation frequency and the natural resonance frequency of the circuit. Furthermore, by being able to track the source frequency, the circuit will automatically compensates for the decrease of resonance amplitude because of frequency misalignment due to the circuit's parameter variations due to component aging or surrounding condition change or coupling change.

The circuit's amplitude-frequency relationship can be determined from the phasor form of (6), given by (10):

$$(j\omega)^2 Z + \frac{R}{L}(j\omega)Z + \left(\frac{1}{La_1} + \frac{1}{LC_{\text{eff}}}\right)Z = \frac{V_s}{L} \quad (10)$$

Substituting (8) in (10) results in (11):

$$A^2\left(\frac{1}{La_1} + \frac{3}{4} \cdot \frac{1}{La_3}A^2 - \omega^2\right)^2 + \left(\frac{R}{L} \cdot A\omega\right)^2 = \left(\frac{V_s}{L}\right)^2 \quad (11)$$

The charge "A" can be determined from (11) as a function of $\omega$. Subsequently, the resonance voltage $v_C$ can be calculated from (4) using $q_C = A\cos(\omega t)$. It is readily understood that the other nonlinear resonance circuits shown in FIGS. 1B-1D can be analyzed with similar approach and thereby resulting in similar circuit equations.

Figure 6:
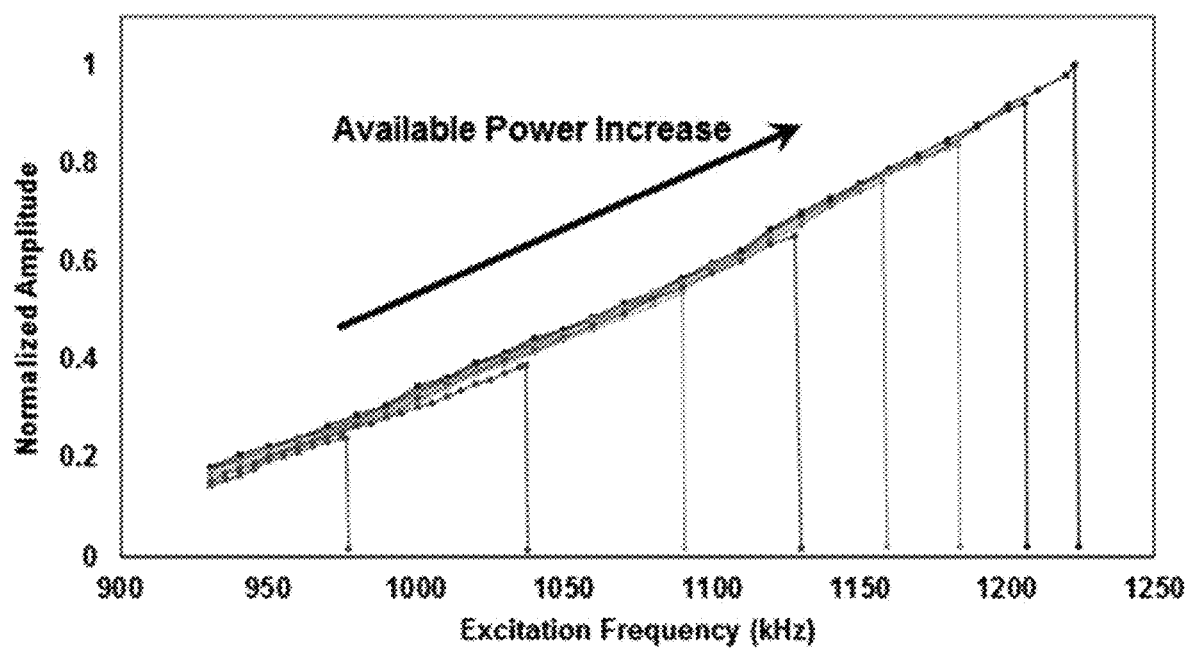
FIG. 6 is a graph depicting measurement results which represent typical amplitude-frequency response of a nonlinear resonance circuit at different available power levels.

FIG. 6 shows the circuit's amplitude-frequency relationship at different available power levels from the source. It can be observed that the slope of the amplitude-frequency curves are not influenced by the power level. Therefore, the bandwidth of the nonlinear resonance circuit, which is defined as the frequency band where the amplitude is greater than $1/\sqrt{2}$ of peak amplitude, is independent of available power levels. At the same time, it can be noted that the amplitude is stable regardless of power level variation when operating at a given frequency. As the available power level increases, the peak of the amplitude response increases but appears at a higher frequency.

Figure 7:
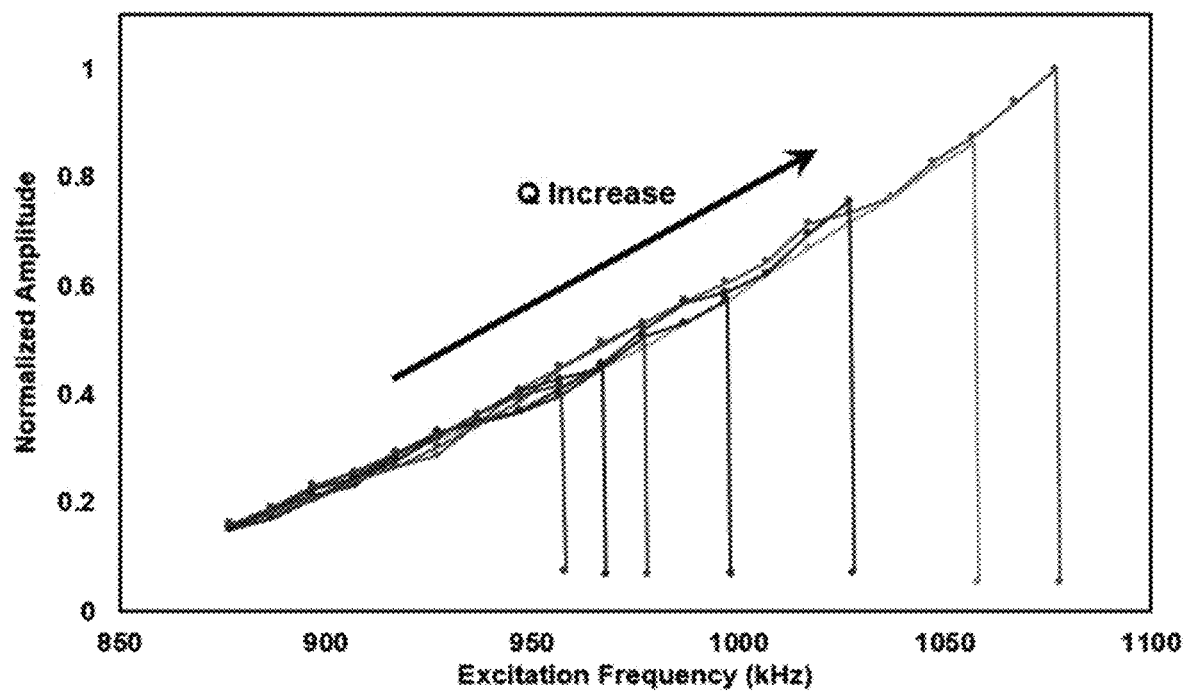
FIG. 7 is a graph depicting measurement results which represent typical amplitude-frequency response of a nonlinear resonance circuit at different loaded Q values.

FIG. 7 shows the circuit's amplitude-frequency relationship at different loaded Q values of the nonlinear resonator. The loaded Q values of the circuit changes as the circuit is connected to different load resistances. It can be seen that as the circuit's Q increases, the jump down point occurs at higher frequencies, and peak amplitude increases. At the same time, it can be noted that the amplitude is stable regardless of circuit Q when operating at a given frequency. The amplitude-frequency plots for different Q values have similar slopes. Therefore, the bandwidth of the nonlinear resonance circuit is independent of circuit Q. This behavior is significantly different from a linear resonator's response whose bandwidth is inversely proportional to Q.

Based on FIGS. 6 and 7, two important features can be concluded. First, since the nonlinear resonance circuit has a bandwidth independent of Q, it can achieve high amplitudes without the penalty of bandwidth. Secondly, since the amplitude is independent of both power level and circuit loaded Q, the nonlinear resonance circuit acts as an ideal source with negligible internal resistance, which is highly favorable for circuit design.

Because of the abovementioned properties, the nonlinear resonance circuit is useful in applications where high amplitude through Q multiplication is needed, and at the same time wide bandwidth and stable amplitude is desirable. Wireless power harvesting systems and wireless power transfer systems are two typical application areas. Usage of the wideband nonlinear resonance circuit in other applications such as matching circuit design, etc. also falls into the scope of this disclosure.

Figure 8:
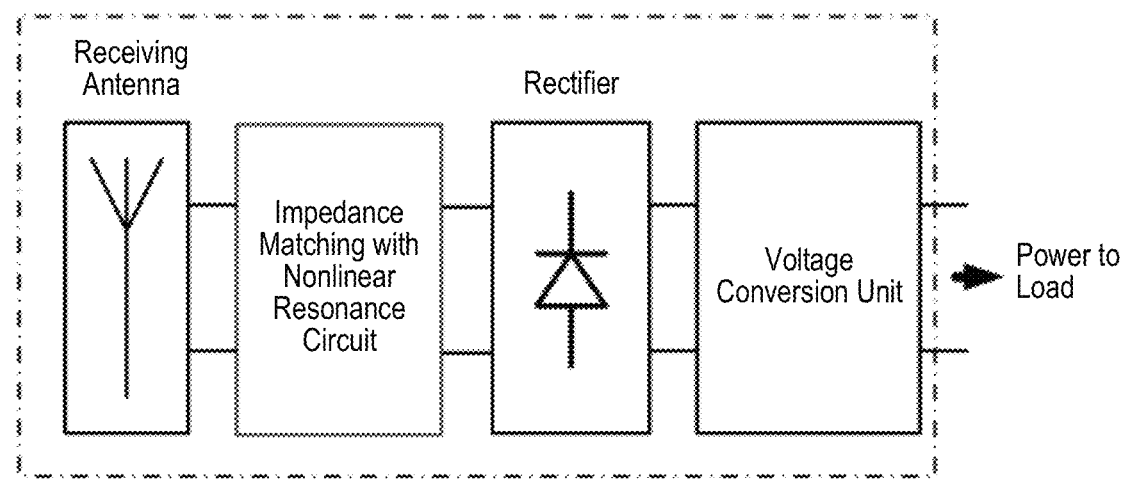
FIG. 8 is a block diagram for an example of wireless power harvesting system using the nonlinear resonance circuit.

FIG. 8 depicts a typical wireless power harvesting system 60 which employs a nonlinear resonance circuit. In this system, RF power is received by an antenna 81. The collected RF power is then rectified by a rectifier 83 and regulated by a voltage regulator 84 before being delivered to a load. An impedance matching network 82 is connected between the antenna 81 and the rectifier 83 to minimize reflections. A high quality factor resonator is preferable used in the matching network to increase RF voltage. In one example, the resonator is a nonlinear resonance circuit in accordance with this disclosure. While reference is made to an antenna, it is understood that the antenna may be replaced with other types of energy pickup element within the broader aspects of this disclosure.

Figure 9:
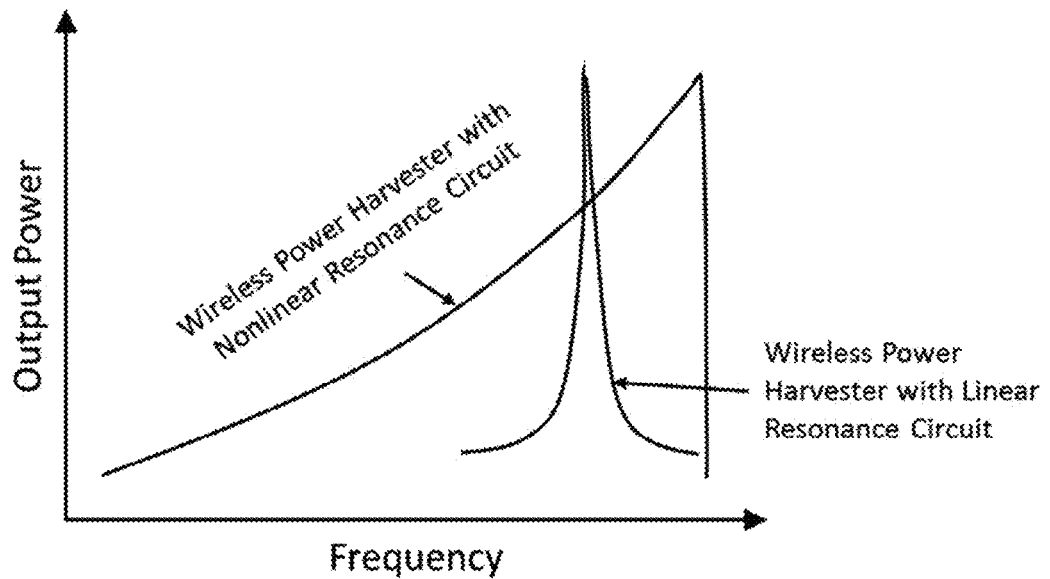
FIG. 9 is a graph depicting the output power of the nonlinear resonance circuit in comparison with a linear LC resonator tested under the same conditions.

FIG. 9 illustrates the typical output power as a function of frequency for a wireless power harvester using the nonlinear resonance impedance matching circuit (connected to optimal load resistance). For comparison, the output power of a harvester with a linear impedance matching circuit is also depicted. The bandwidth of the nonlinear resonator described is significantly greater as compared to the linear resonator, while both circuits provide similar peak power. Consequently, the tolerance on frequency misalignment due to component aging, environmental variations and coupling to surrounding objects is significantly improved.

Figure 10:
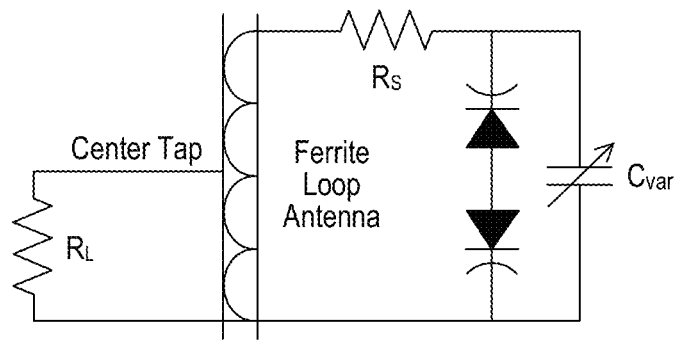
FIG. 10 is a schematic of an example embodiment of a wireless power harvester employing the nonlinear resonance circuit.

FIG. 10 depicts an example embodiment of a nonlinear resonance circuit 90 which is incorporated into a wireless power harvester system 80. The nonlinear resonance circuit 90 is comprised of an inductor electrically coupled to a nonlinear capacitor 92. In this embodiment, the nonlinear capacitor 92 is implemented by two varactor diodes coupled in anti-series with each other and thereby providing the required bell-shaped C-V curve. A ferrite rod antenna 91 is used for receiving RF energy as well as providing the inductance value L in the resonator. Rs represents the antenna and varactor diodes losses, and is measured to be approximately 33Ω. A small trimmer capacitor $C_{var}$ is connected in parallel with the varactor diodes for fine tuning of the circuit. $C_{var}$ is small as compared to the varactor capacitance, and therefore has minimal influence of the circuit operation. The unloaded small signal Q of the resonator is measured to be approximately 160. $R_L$ represents the load resistance, and is coupled to the resonator through an autotransformer which is formed using a center tap of the antenna winding. By changing the position of the center tap, the transformer ratio is varied, allowing the load resistance $R_L$ to be matched to the optimum resistance (i.e. $R_S = 33Ω$) for the maximum power transfer. While specific reference is made to two varactor diodes, the nonlinear C-V characterization can be provided by a wide range of devices for example but not limited to: anti-series connected varactor diodes (biased or un-biased); ferroelectric varactors; and ceramic capacitors used at voltage levels allowing them to exhibit nonlinearity.

The coefficients in the Duffing equation $a_1$ and $a_3$ can be derived from the C-V function of the nonlinear devices. As an example, an analysis of the anti-series connected varactor diodes is given as follows. Generally speaking, the capacitance of a single varactor diodes has voltage dependence as (A-1):

$$C = \frac{C_{jo}}{\left(1 + \frac{V_R}{V_J}\right)^n} + C_p \quad (A-1)$$

where $C_{jo}$ is the junction capacitance, $V_R$ is the reverse bias voltage, $V_j$ is the built-in junction voltage (around 0.7 V for silicon and 1.3 V for gallium arsenide), and n is the grading coefficient. The parametric capacitance $C_p$ is usually small and can be neglected. Thus, (A-1) can be expanded into its Maclaurin series expression as (A-2):

$$C = \sum_{m=0}^{\infty} \frac{C_V^{(m)}(0)}{m!} V_R^m \quad (A-2)$$

where the first 3 items are shown in (A-3):

$$\begin{cases} k_0 = C_V(0) = C_{jo} \\ k_1 = \frac{C_V'(0)}{1!} = -C_{jo}\frac{n}{V_J} \\ k_2 = \frac{C_V''(0)}{2!} = C_{jo}\frac{n(n+1)}{2 \cdot V_J^2} \end{cases} \quad (A-3)$$

Neglecting terms higher than third order results in (A-4):

$$C_V(V_C) \approx k_0 + k_1 V_C + k_2 V_C^2 \quad (A\text{-}4)$$

Assuming the two diodes are exactly the same results in (A-5):

$$\begin{cases} C_V(V_1) = k_0 - k_1 V_1 + k_2 V_1^2 \\ C_V(V_2) = k_0 + k_1 V_2 + k_2 V_2^2 \end{cases} \quad (A\text{-}5)$$

The charges on each capacitor can be calculated from $Q_c = \int_0^v f(v) \cdot dv$ as (A-6):

$$\begin{cases} Q_1(V_1) = k_0 V_1 - \frac{k_1}{2} V_1^2 + \frac{k_2}{3} V_1^3 - \frac{k_3}{4} V_1^4 \\ Q_2(V_2) = k_0 V_2 - \frac{k_2}{2} V_2^2 + \frac{k_2}{3} V_2^3 - \frac{k_3}{4} V_2^4 \end{cases} \quad (A\text{-}6)$$

Since the bias point is ac-isolated, the charge on each capacitor would be equal ($Q_1 = Q_2 = Q_C$). A-6 can be rewritten in the form of A-7 by applying the series reversion technique:

$$\begin{cases} V_1 = \frac{Q_C}{k_0} + \frac{k_1}{2k_0^3} Q_C^2 + \frac{1}{k_0^5}\left(\frac{k_1^2}{2} - \frac{k_0 k_2}{3}\right) Q_C^3 \\ V_2 = \frac{Q_c}{k_0} - \frac{k_1}{2k_0^3} Q_C^2 + \frac{1}{k_0^5}\left(\frac{k_1^2}{2} - \frac{k_0 k_2}{3}\right) Q_C^3 \end{cases} \quad (A\text{-}7)$$

which indicates $$V = V_1 + V_2 = \frac{2Q_C}{k_0} + \frac{2}{k_0^5}\left(\frac{k_1^2}{2} - \frac{k_0 k_2}{3}\right) Q_C^3 \quad (A\text{-}8)$$

Comparing A-8 with Eq. 5, the coefficients in the Duffing equation $a_1$ and $a_3$ can be derived as (A-9):

$$\begin{cases} a_1 = \left(\frac{2}{k_0}\right)^{-1} = \frac{C_{jo}}{2} \\ a_3 = \left(\frac{2}{k_0^5}\left(\frac{k_1^2}{2} - \frac{k_0 k_2}{3}\right)\right)^{-1} = \frac{3V_j^2}{n(2n-1)} C_{jo}^3 \end{cases} \quad (A\text{-}9)$$

The properties of the nonlinear resonance circuit shown in FIG. 10 are studied through simulations and measurements. The wireless power harvester 80 containing the nonlinear resonance circuit has been designed to operate at 1 MHz and studied. It needs to be mentioned that the circuit design method described in this disclosure is not limited to a particular frequency band or power level. Since high Q nonlinear capacitors are available at GHz or even higher frequencies and voltage rating from several volts to thousands of volts, the method can be employed in a very wide range of frequencies and power levels.

In the lab measurement setup, a 30-cm-diameter 5-turn coil antenna connected to a signal generator (Agilent 33220A) is used as a transmit antenna to generate the ambient EM field. The harvester is positioned at 1 m away from the antenna. For comparison, a harvester using a linear resonator with the same quality factor is also tested under the same conditions.

Figure 11A:
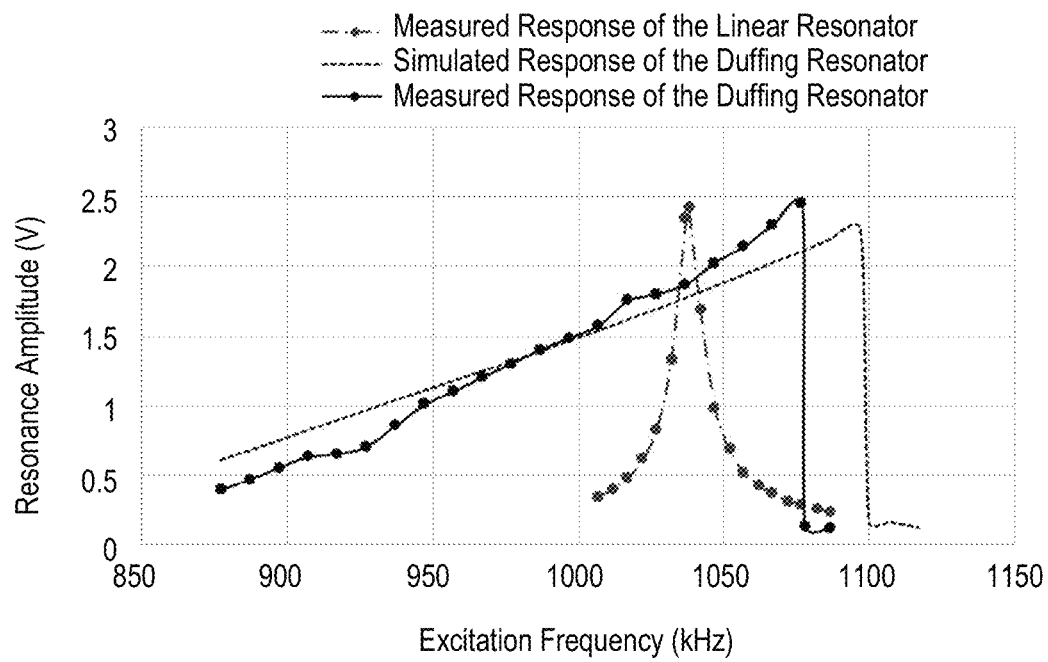
FIGS. 11A and 11B are graphs depicting resonant amplitude of the nonlinear resonator as a function of the excitation frequency with no load and loaded, respectively.
Figure 11B:
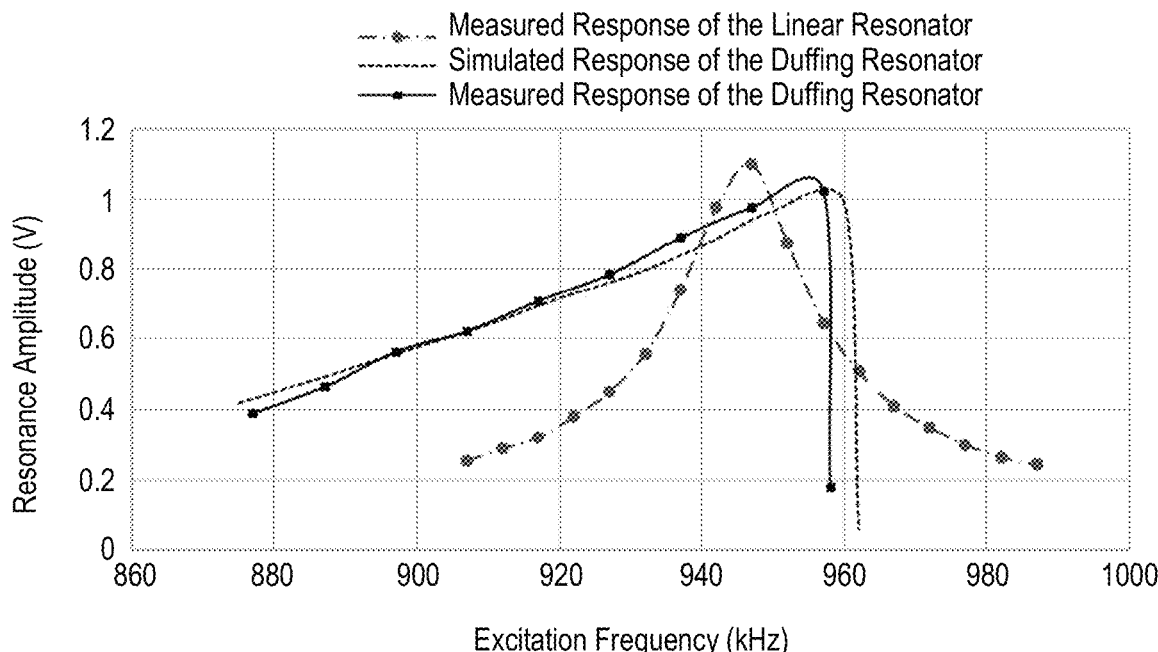

The nonlinear resonance circuit described above is tested versus frequency to show its properties for bandwidth enhancement. First the response of the nonlinear resonator was examined at low power levels. The available RF power level is $P_{av} = 0.7$ uW=−31.5 dBm. FIG. 11A shows the simulated and measured resonance amplitudes at different frequencies when the nonlinear resonator is not connected to an output load and FIG. 11B shows the results when the resonator is connected to an optimum load (equal to $R_s = 33\Omega$). The linear resonator with the same Q is tested under the same condition. The measurement results are also shown in FIGS. 11A and 11B for comparison. It can be observed that, in both cases (loaded and unloaded), the nonlinear resonance circuit demonstrates a significant bandwidth enhancement as compared to the linear resonator. Once the circuit operates at the upper equilibrium point, the resonance amplitude is dictated by the upper curve as the excitation frequency changes. This produces a very wide frequency band where the resonance amplitude of nonlinear resonator is significantly higher than that of a linear resonator. On the other hand, the nonlinear resonator achieves similar amplitude level as the linear resonator near the resonance frequency.

Figure 12:
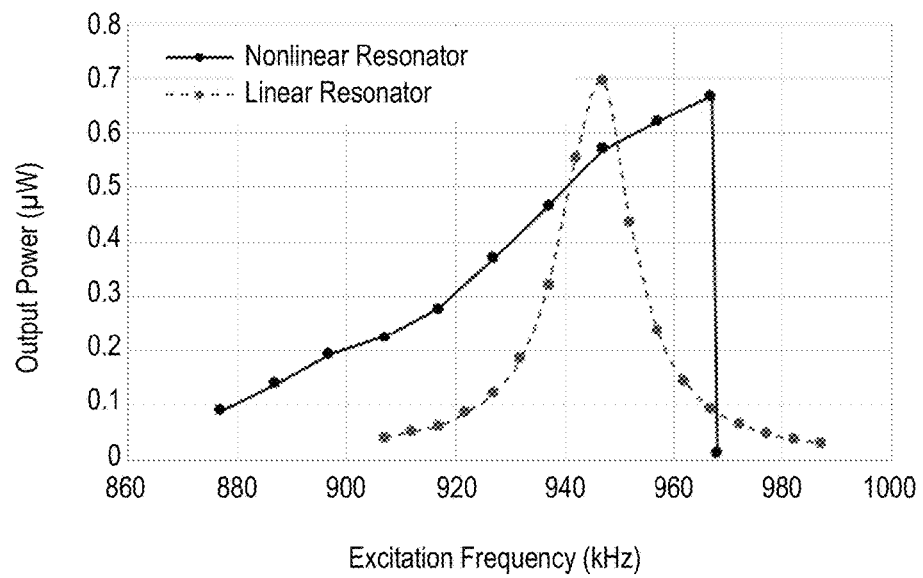
FIG. 12 is a graph depicting measured output power of the nonlinear resonance circuit in comparison with a linear LC resonator.

FIG. 12 shows the output power of the nonlinear circuit as function of frequency, in comparison with the output power of a linear resonator. Both circuits are connected to optimum loads. The bandwidth here is defined as the frequency range where the output power is half of its maximum value. It can be seen that in this experiment, the bandwidth of the nonlinear resonator is larger by a factor of 2.7 (915-962 kHz) as compared to the linear resonator's bandwidth (938-955 kHz). Consequently, the nonlinear resonator is much less sensitive to frequency misalignment as compared to a linear resonator. Therefore, the effect of frequency detuning due to component aging, environmental variations and coupling to surrounding objects on power transfer efficiency is reduced.

The influence of the available power level on the nonlinear resonator's operation has also been studied. The available power is varied within a 25 times range of input power from 0.2 µW to 5 µW. FIG. 6 shows the circuit's amplitude-frequency relationship at different power levels available from the source. It can be observed that the slope of the amplitude-frequency curves are not influenced by the available power levels. It can also be noted that as the available power level increases, the peak resonance amplitude increases, and the jump down point moves to higher frequencies. The reason for such a behavior is that the average capacitance of the varactor decreases as the voltage swing across it increases. In practical applications, it is desirable to operate close to the jump down point in order to maximize the power transfer. The operation frequency of the nonlinear resonator in a power harvesting system should be chosen according to the expected available power level in the environment, as will be further discussed later on in this disclosure.

The loaded Q values of the resonator, influenced by circuit losses including the load resistances ($R_L$), is another important factor that affects the circuit's frequency response. Here the effect of varying the load resistance on the nonlinear resonator's response has been experimentally investigated. It needs to be noted that in practical applications it is always desirable to transform $R_L$ to the optimum load resistance that matches to the source resistance $R_S$ for the maximum power transfer. In this experiment, the available RF power level is $P_{av} = 0.7$ uW=−31.5 dBm. The load resistance is varied such that the loaded Q of the resonator changes within the range from 72 to 160. FIG. 7 shows the circuit's amplitude-frequency relationship at different Q values. It can be seen from FIG. 7 that the jump down point occurs at higher frequencies, and peak resonance amplitude reaches higher values at the circuit's Q increases. However, it is important to note that the amplitude-frequency plots for different Q values have similar slopes. Therefore, the bandwidth of the resonator, which is defined as the frequency band where the amplitude is greater than $1/\sqrt{2}$ of peak amplitude, is not obviously influenced by Q. This behavior is significantly different from a proportional to Q.

FIG. 13 depicts an example embodiment of a wireless power transfer system 150 utilizing the nonlinear resonator set forth in this disclosure. An inductively-coupled wireless power transfer system 150 contains two or more resonant coils. In a two-coil system, the power source 151 drives a primary coil 153. The secondary coil 154, which is magnetically coupled to the primary coil 153, captures the RF power transmitted through time-varying magnetic field. The RF power is then converted to DC using a rectifier 156. There are impedance transformation networks 152, 155 in both the transmitter and the receiver to match the impedance of the coils to the source driver 151 and rectifier 156. In the receiver, a power management unit 157 regulates the output DC power and provides the required voltage level depending on the application. Multiple (>2) resonant coils can also be utilized to optimize the system transfer characteristics. In a two-coil wireless power transfer system as an example, the nonlinear resonance circuit described herein can be used in the impedance matching networks 1562, 155 in both the transmitter and receiver. In a multiple coil system, the nonlinear resonance circuit can be used in the intermittent coils as well.

FIGS. 14A-14D depicts four different topologies of the two-coil wireless power transfer system 150: series-series; series-shunt; shunt-series; shunt-shunt topologies, respectively. One or more of the four reactive components: capacitor and inductor at the transmitter, and capacitor and inductor at the receiver, can be nonlinear to implement the nonlinear resonance circuit described herein.

FIG. 15 depicts an example embodiment of a wireless power transfer system employing the nonlinear resonance circuit. In this embodiment, the series-series topology is shown with a nonlinear capacitor $C_2$ on the receive side. It is readily understood that other topologies including those shown in FIGS. 14A-14D can incorporate a nonlinear resonance circuit in a similar manner.

FIG. 16 shows the typical overall efficiency (calculated as the ratio of output power over the available RF power from the source, $\eta=P_{out}/P_{av}$) as a function of coupling distance (which directly influences coupling factor) for a wireless power transfer system using the nonlinear resonance circuit. For comparison, the overall efficiency of a wireless power transfer system with a linear impedance matching circuit is also depicted. With the nonlinear resonance circuit, near-constant efficiency can be achieved over a wide range of coupling distance variations, which is improved significantly compared to a conventional wireless power transfer system. Both circuits are able to achieve a similar peak efficiency.

FIG. 17 depicts measurement results showing the comparison between the power transfer efficiency as a function of the coupling factor (i.e. the distance between transmit and receive coils) achieved by using the nonlinear resonator discussed in this disclosure and a linear resonator. A significant improvement in power transfer efficiency as a function of the coupling factor is expected.

In some embodiments, the nonlinear resonance circuit can be comprised of a nonlinear inductor rather than a nonlinear capacitor. As an example, the required nonlinear inductance can be provided by inductors with ferrite core. Depending on the magnetic field intensity inside the ferrite material, characteristics change. The permeability of the ferrite core decreases as magnetic field intensity increases in the saturation region (when the current flow through the inductor is strong enough). Therefore, ferrite core inductors can exhibit a bell-shaped L-V curve. Thus, as indicated throughout this disclosure, the nonlinear resonance circuit may be implemented with a nonlinear inductor as well.

FIG. 18 depicts a typical capacitive wireless power transmission system. It is envisioned that the nonlinear resonance circuit described in this disclosure can also be employed in a capacitively coupled wireless power transfer systems where the electric field coupling is used to transfer energy. An example embodiment of a capacitive wireless power transfer system utilizing the nonlinear resonator is shown in FIG. 19. In a capacitive wireless power transfer system, the power is transferred between the transmitting and receiving electrodes which are coupled to each other through a time varying electric field. Resonance structure can be used for voltage transformation between the source driver and the transmitting electrode, as well as between the receiving electrode and the rectifier. Similar to its application in inductive power transfer systems, the nonlinear resonance circuit set forth in this disclosure can be used in capacitive wireless power transfer systems. This allows electric field intensity to significantly increase thereby providing a high conversion ratio and therefore high power capability and efficiency while improving the system's tolerance to coupling factor variation due to distance change, misalignment, component value variation due to aging, etc. Thus, this concepts set forth herein are applicable to both inductive as well as capacitive based wireless power transfer and harvesting systems.

In another aspect of this disclosure, near field magnetic resonance wireless power transmission can be accomplished by employing nonlinear dielectric resonators instead of coil-capacitor resonators. Dielectric resonators are made of low loss dielectric material, such that the electromagnetic field is confined inside the resonator material by the abrupt change in permittivity at the surface. Two or more dielectric resonators can be coupled together with their equivalent circuit model being the same as magnetically coupled LC resonators in conventional wireless power transfer systems. At the resonant frequency the electromagnetic field forms standing waves in the resonator and oscillate at large amplitudes. The dielectric materials employed on dielectric resonators are usually low-loss, achieving very high quality factor on the order of several hundred to several thousand. The field strength is thus amplified through Q multiplication to reach high values, in the order of hundreds to thousands of volts per centimeters. Such a field strength is strong enough to drive the dielectric materials (such as BST or X7R ceramics) into their nonlinear region, exhibiting field-strength-dependent permittivity. The nonlinear permittivity can then be exploited to design nonlinear wireless power harvesters described by the Duffing Equations and achieve coupling-factor-independent wireless power transmission.

FIGS. 20A and 20B depicts a wireless power transmission system 200 having a transmit resonator 202 in close proximity to a receive resonator 204. At least one (or both) of the transmit resonator 202 and the receive resonator 204 is comprised of a dielectric resonator, where permittivity of the dielectric material exhibits a nonlinear response to an applied electric field as seen in FIG. 21. In one embodiment, the entire resonator is comprised of a suitable dielectric material; whereas, in other embodiments, only a portion of the resonator is comprised of a suitable dielectric material. Suitable nonlinear dielectric materials include but are not limited to barium titanate and barium strontium titanate. More specifically, the nonlinear response is described by a Duffing equation in the same manner as set forth above. That is, the nonlinear response is approximated by a polynomial expansion, such that the polynomial expansion includes a constant and even order terms, and the even order terms of the polynomial expansion are dominant.

In one embodiment, the nonlinear dielectric resonators are in the shape of a cylinder as seen in FIG. 20A. In another embodiment, the nonlinear dielectric resonators are in the shape of a sphere as seen in FIG. 20B. Other shapes for the resonator, including a toroidal, are contemplated by this disclosure.

FIG. 22 depicts an equivalent circuit model for the wireless power transfer system with nonlinear dielectric resonators. In this case, the nonlinear dielectric resonators are modeled as LC resonant circuits. As an example, the resonant mode of nonlinear dielectric resonator with a cylinder shape is $TE_{01\delta}$ where its magnetic field distribution is similar to a magnetic dipole is excited which provides field distribution similar to a resonant coil. The dominant mode of the dielectric resonator can be excited by methods such as a drive loop or coaxial line through magnetic or electric field coupling.

The resonance frequencies and modes of such resonators are largely determined by their dimensions. The commonly used resonant mode of such resonators is $TE_{01\delta}$, where magnetic field lines are contained in the meridian plane while the electric field lines are concentric circles around the z axis and therefore this mode is referred to as magnetic dipole mode for the resonator. The resonance frequency of such resonators can be determined through numerical solution of Maxwell's equations however approximate solutions for determining the resonance frequency of a cylindrical dielectric resonator is given by:

$$f_r = \frac{34}{a\epsilon_r}\left(\frac{a}{h} + 3.45\right)$$

where $f_r$ is the resonance frequency in MHz, a is the radius of the resonator in meter and h is the height of the dielectric resonator.

In an alternative embodiment, at least one of the transmit resonator 202 or the receive resonator 204 includes one or more electronic components 108 embedded therein as seen in FIG. 23, where the electronic component 108 exhibits a nonlinear response to an applied electric field. In a similar manner, the nonlinear response of the electronic components is approximated by a polynomial expansion, such that the polynomial expansion includes a constant and even order terms, and the even order terms of the polynomial expansion are dominant. In one example, the electronic component is implemented by two varactor diodes coupled in anti-series with each other although other implementations are also contemplated by this disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A wireless power transmission system, comprising:
an excitation source;
a transmit resonator electrically or magnetically coupled to the excitation source; and
a receive resonator disposed proximate to the transmit resonator, where at least one of the transmit resonator or the receive resonator is comprised of a dielectric material and permittivity of the dielectric material exhibits nonlinear response to an applied electric field, wherein nonlinear response is approximated by a polynomial expansion, such that the polynomial expansion includes a constant and even order terms, and the even order terms of the polynomial expansion are dominant.

2. The wireless power transmission system of claim 1 where at least one of the transmit resonator or the receive resonator is in shape of a cylinder, a toroidal or a sphere.

3. The wireless power transmission system of claim 1 where at least one of the transmit resonator or the receive resonator is comprised of barium strontium titanate or barium titanate.

4. A wireless power transmission system, comprising:
an excitation source;
a transmit resonator electrically or magnetically coupled to the excitation source; and
a receive resonator disposed proximate to the transmit resonator, where at least one of the transmit resonator or the receive resonator includes an electronic component embedded therein, where the electronic component exhibits a nonlinear response to an applied electric field, wherein nonlinear response is approximated by a polynomial expansion, such that the polynomial expansion includes a constant and even order terms, and the even order terms of the polynomial expansion are dominant.

5. The wireless power transmission system of claim 4 where the electronic component is two varactor diodes coupled in anti-series with each other.

6. A wireless power transmission system, comprising:
an excitation source;
a transmit resonator electrically or magnetically coupled to the excitation source; and
a receive resonator disposed proximate to the transmit resonator, where at least one of the transmit resonator or the receive resonator is comprised of a material with permittivity, permeability or both, such that the at least one of the transmit resonator or the receive resonator exhibits a nonlinear response under excitation, wherein nonlinear response is approximated by a polynomial expansion, such that the polynomial expansion includes a constant and exhibits even symmetry, where the even order terms of the polynomial expansion are dominant.

* * * * *